United States Patent [19]

Gibbs

[11] Patent Number: 5,017,164
[45] Date of Patent: May 21, 1991

[54] SURFACE MOUNT I.C. PIN ARRAY SYSTEM

[76] Inventor: Andrew H. Gibbs, 2313 Saidel Way, San Jose, Calif. 95124

[21] Appl. No.: 524,156

[22] Filed: May 16, 1990

[51] Int. Cl.$^5$ .......................................... H01R 13/02
[52] U.S. Cl. ..................... 439/885; 439/83; 206/330
[58] Field of Search ................. 439/78, 83, 876, 885; 29/842, 843, 884; 228/180.2; 206/328, 329, 330, 331

[56] References Cited

U.S. PATENT DOCUMENTS

| 3,750,252 | 8/1973 | Landman | 228/180.2 |
| 3,993,383 | 11/1976 | Marino | 439/885 X |
| 4,035,047 | 7/1977 | Ammon | 439/78 |
| 4,178,678 | 12/1979 | Carrillo et al. | 29/843 |
| 4,616,416 | 10/1986 | Cabaud | 439/885 X |
| 4,952,529 | 8/1990 | Grider | 439/78 |

Primary Examiner—Neil Abrams
Assistant Examiner—Khiem Nguyen
Attorney, Agent, or Firm—Thomas E. Schatzel

[57] ABSTRACT

A surface mounted printed circuit board connector system that keeps pins for attachment to SMT PCB's in close alignment through the positioning and soldering operations of assembly, and which contains a carrier strip that rips off from one end along the surface of the SMT PCB, and to which thermoplastic accessories may be attached.

24 Claims, 7 Drawing Sheets

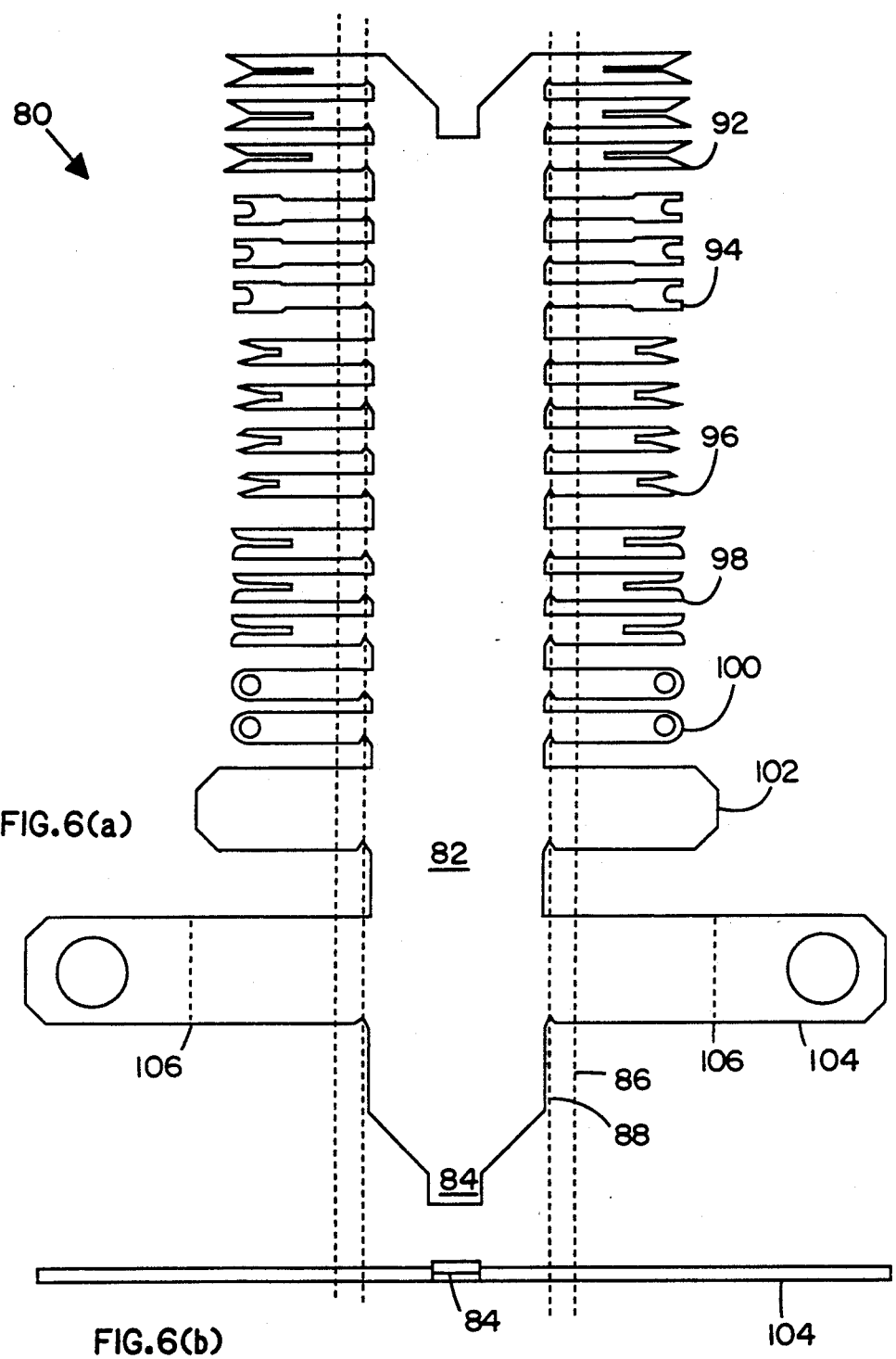
FIG.6(a)
FIG.6(b)
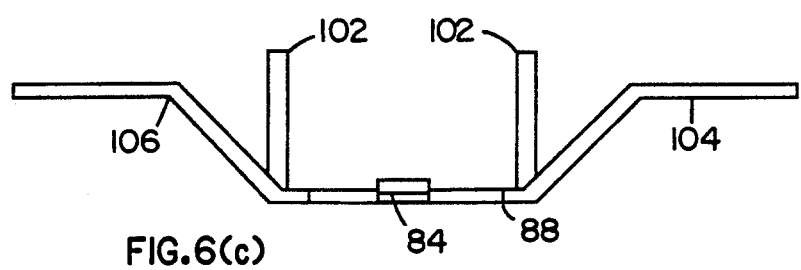
FIG.6(c)

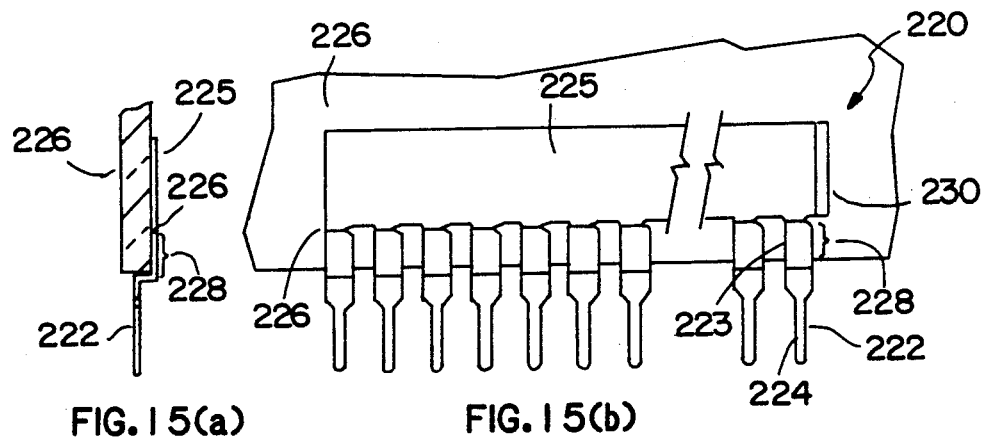
FIG. 15(a)   FIG. 15(b)
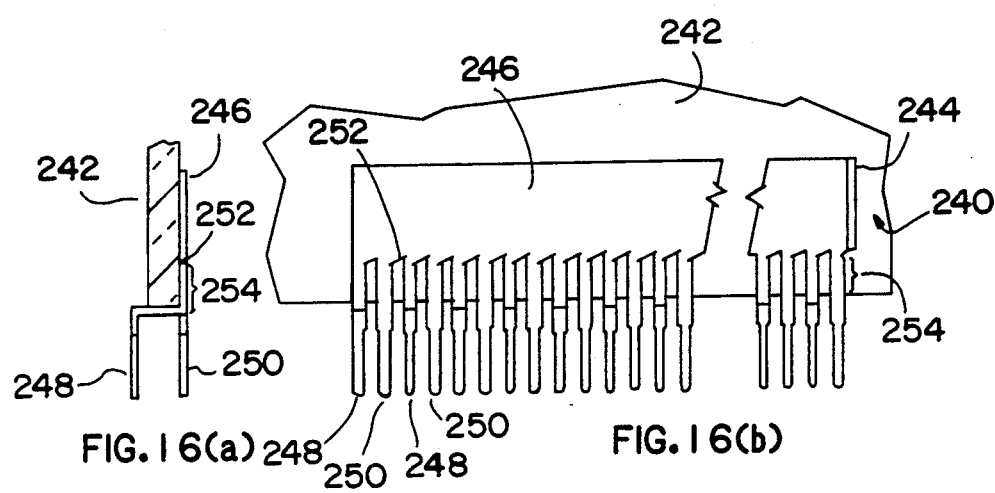
FIG. 16(a)   FIG. 16(b)
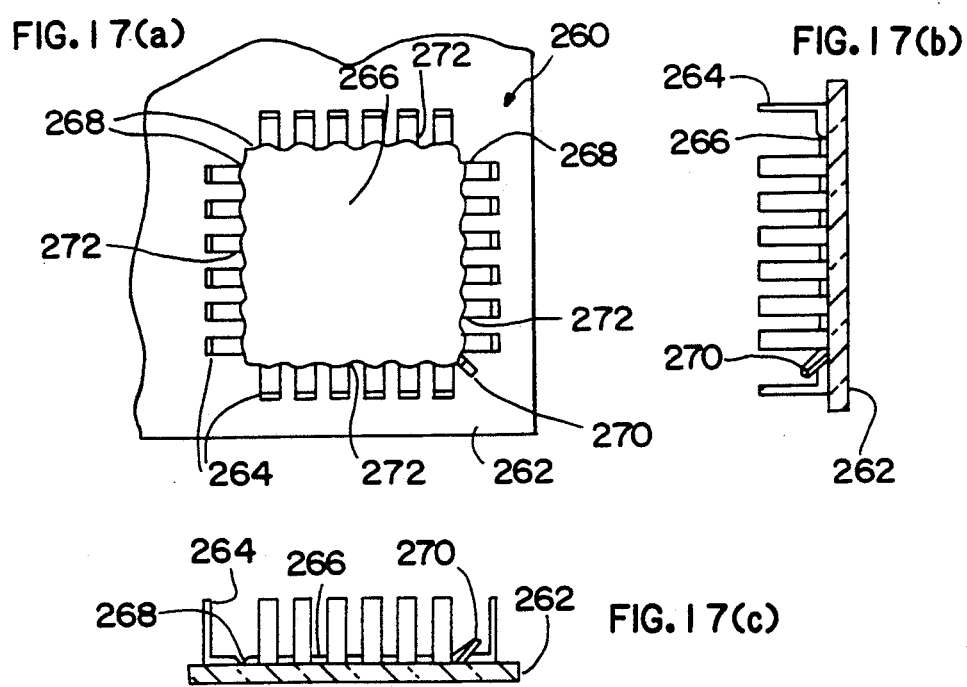
FIG. 17(a)   FIG. 17(b)
FIG. 17(c)

SURFACE MOUNT I.C. PIN ARRAY SYSTEM

BACKGROUND OF THE INVENTION

1. Field of the Invention

The invention relates generally to printed circuit board connectors and specifically to single in-line package (SIP), dual in-line package (DIP), and quad-pack (QUAD) connector systems for use on surface mount technology printed circuit boards.

2. Description of the Prior Art

Forming an electrical connection between separate and different electrical circuits is accomplished through soldering electrically conductive members between the circuits, or by plugging together connectors with each connector half electrically and mechanically attached to the circuits to be connected together.

Electronic circuits have recently become so miniaturized that the connector size relatively dwarfs the circuit it is connected to. In the case of integrated circuit (IC) chips, very small wires are electrically bonded to surfaces of the "lands" on the chip allowing electrical interface with another circuit, usually by means of connection to IC pins and subsequently to other components by being soldered into a printed circuit board (PCB). These IC pins are actually individual projections from a lead-frame, a fabricated metal structure with small details (leads) usually integrally connected to a supporting structure (frame). These are later separated from the frame by various means leaving a group of electrically isolated contact pins. Another method of electrical connection between the chip and lead-frame is surface mount technology (SMT). In SMT, the lead-frame, a continuous metal strip with pins, receives the circuit substrate (chip). Surface-mount components do not mount on a PCB in a "through hole," but rather they are held by solder at a flat, surface solder pad on the PCB. Solderable flat surfaces of the lead-frame are brought into parallel surface contact with the solderable flat surfaces of the chip and then soldered.

Mounting components on the surface of a PCB (e.g., SMT) involves the application of a highly viscous solder alloy by silk-screening methods to various solder joint locations on the flat surface of the PCB. Such a solder "paste" will retain the loaded components in the correct position up through the soldering process. Reflow soldering—where the PCB carrying the loaded components and the solder paste is baked in an elevated temperature chamber—is achieved when the joint temperatures reach about 250° C. Reflow temperatures are commonly accomplished by "vapor phase" or infra-red technologies. Either way, the solder paste liquifies and coats the solder contacts of the respective parts and the PCB's solder pads. Thereafter the cooling of the assembly causes solidification of the solder, and electrical and mechanical bonding of the surface mounted component to the PCB is completed.

Through-hole soldering—in contrast to SMT—requires projections of the components to be inserted into holes drilled through a PCB. Solder is then applied with heat to the projection on the non-component side of the PCB. Wave soldering is a technique commonly employed in high volume production. A consequence of through-hole penetration is equal surface areas on both sides of the PCB equal to the area occupied by a single component are consumed. Through-hole technology therefore reduces the useable PCB area occupied by a single component by one half, compared to SMT.

Both SMT and through-hole soldering technology are conventional, and presently are in wide use in the electronics industry.

Electrical connections made from a PCB to another PCB, or from a PCB to a cable, usually employs electro-mechanical connectors. Socket and PCB stacking interconnect is accomplished in the prior art by discrete screw machine fabricated or progressive die stamped pins, either auto-inserted or manually inserted individually into a PCB or into a plastic connector body. In the latter case, the projecting non-press fit pins are thereafter inserted through holes in the PCB and then soldered to provide both mechanical and electrical integrity. Today, both round and square pins are popular, and both are available in plastic strips that hold the pins at a particular pin to pin spacing (e.g., 0.1"). In response to the increased electronic industry demand for surface mounted connectors, various manufacturers have responded by simply bending the projecting pins laterally outward from the longitudinal center line of connector, at right angles to each, such that the right angle surfaces of the in-line pins can be soldered to the top surface of a PCB; instead of the non-SMT practice of requiring the pins to be inserted through some holes in the PCB.

Individually fabricated pins inserted into removable thermoplastic or metal carriers are available which maintain alignment and spacing for placement on PCB's. But no removable carrier for surface mountable PCB pins manufactured from the same piece of material as the demountable pins is known to be available.

The attachment of chip circuits to metal lead-frames is conventional. Even though flat integrated circuit (IC) pins are widely stamp or photo-chemically etch manufactured for attachment to IC packages, no SMT pin arrays are known to be available—this is odd because SMT parts provide the mechanical integrity of connectors and are fabricated similarly to lead-frame technology. The U.S. Pat. No. 4,054,238 ('238) of Lloyd, et al., is an example of a continuous strip of lead frames that are attached to substrates using through holes. The free ends of lead frame pins have a tendency to be bent and to lose their parallel alignment with one another, thus causing a pin misalignment in the finished assembly.

Ceramic IC packages, with solder lands on the two opposite long sides to receive pins, presented a special case in U.S. Pat. No. 4,232,815 ('815) by Nakano, et al. The solution involved lead frames that are bent into U-channels and have two rows of pins attached at one end on two rows of carriers, called lead frame rail members, which are spaced equal to the width of the ceramic IC. Since the pins in Nakano, et al., are floating at one end, the end by the way that will receive the ceramic IC, there is a chance the introduction of the ceramic IC will cause a few of the pins to be bent out of alignment with one another. The Nakano patent outlines the means of attaching a substrate (ceramic IC) to the lead-frame as a production means.

The U.S. Pat. No. 3,859,718 ('718) of Noe addresses the problem of pin bending on a lead frame by carrying all the pins (for dual in-line applications) at a point across their centers. A "punching means" removes the carriers after the lead frames are soldered to the circuit. Carrying the pins at their centers doesn't prevent the pins from twisting axially about their carriers, and so only the direction of possible pin misalignment has been changed. In addition, a disadvantage of using a punching means is that the PCB must not interfere with the punch's access, and a further disadvantage is the punching means itself is an expensive apparatus that is best eliminated altogether, if possible. A similar lead frame to Noe is found in U.S. Pat. No. 4,439,918 ('918) of Carroll, II, et al. The center strip in Carroll, II, et al., is called a "tie bar" and is said to hold individual pins in alignment and groups of pins together in continuous strips. The tie bars are removed, after soldering and package molding, by a cutting and trimming step. Both Noe and Carroll teach a means to manufacture IC's that attaches substrates to continuous strip lead-frames. Neither teaches single piece lead-frames which are designed to be individually handled and attached to the flats of a substrate.

A pair of attached support carriers is to be found in the U.S. Pat. No. 4,178,678 ('678) of Carillo, et al. Each contact (pin) is carried between a pair of support carriers, but those carriers are severed at a first station, leaving only an adhesive tape to maintain the contacts' alignment. The contacts and adhesive tape are then brought into position with a PCB and then soldered. The adhesive tape is thereafter removed. Carillo, et al., demonstrate only a through-hole PCB application and are silent on how the contact pin alignment is maintained through the removal of, what must be, a very strong adhesive tape. They are similarly silent on the application of the described means with regard to the extremely corrosive surface mounting technology and elevated temperature affects on the performance of adhesive tapes, and the circuit contamination which may result from inadequate tape residue removal.

Two carrier strips are used in the U.S. Pat. No. 4,616,416 ('416) of Cabaud, albeit for all but the most important time which is just before pin soldering. In Cabaud, contact pins are arranged alternately head-to-tail between the two carrier strips. The heads of each contact pin are severed from the respective carrier strip it's attached to, and two half-population strips result, each carrying pins by their tails. The duration of time that the pins with these free ends are exposed to the risk of bending is shortened in Cabaud, but not eliminated. Unfortunately, the greatest risk of inadvertent bending of pins on their carriers will occur as the contacts and their respective carrier strips are being brought into position with the PCB just before soldering.

The difficulties that are encountered in the prior art in attaching various pins and connectors arranged in single in-line and dual in-line configurations on SMT PCB's include: unstable, high center of gravity pins which fall over during the pin installation and SMT reflow soldering process, uncontrollable positioning of precise pin and row spacing and parallelism, temperature expansion coefficient differences between dissimilar materials used for pins and pin carriers, high cost of individual placement or insertion of discrete pins or pin strips, higher cost of drilling individual holes in the PCB for pin mounting, higher costs of bending pins on connectors intended for through-hole insertion to accommodate SMT soldering, yet higher costs of replacing low cost plastics with high temperature plastics resistant to high surface mount soldering temperatures, impracticality or difficulty of removing pin spacing tie-bars from the assembly by special cutting or punching tools, and decreased PCB density resulting from a loss of PCB real estate to the area consumed by otherwise unnecessary through holes. A single, easily removable carrier strip can reduce these and other problems.

Whether one carrier strip or two are employed, the most critical end to maintain in pin to pin alignment is the end that is to be soldered to the PCB. With through-hole PCB's, that end has to, of course, pass through a hole, and therefore couldn't be simultaneously left attached to a carrier strip. In SMT PCB applications, this isn't true, and the soldered end of a contact pin can be left attached to a carrier strip, with the additional benefit of maintaining pin-to-pin alignment throughout soldering. The present invention has therefore become commercially useful since the recent widespread use of SMT PCB's has occurred.

Whenever a carrier strip is to be separated from the contact pins that the strip has served to carry, the removal can be assisted and confined to a proper zone by specially weakening the joints between the contact pins and the carrier strip. Such a feature is to be found in U.S. Pat. No. 3,750,252 by Landman. The carrier strips in Landman are broken away from the terminal legs (contact pins) at weakened areas, such that the terminal legs are thereafter electrically isolated. Alternatively, Landman suggests that the carrier strip may be automatically cut from the terminal legs (ostensibly by a machine). No known prior art, however, discusses ripping a carrier strip off the contact pins one-by-one in a zipper fashion, and none discusses designing a weakened area to facilitate a tearing, rather than a folding action, in removing the carrier strip. The folding action is restricted in SIP applications due to interference from the SMT PCB itself, and impossible in DIP applications were attachment is made at both ends of a folding action's lever. Additionally, no known prior art discusses use of a carrier strip for handling, packaging, robot loading to the PCB, or otherwise being used for a reason other than to maintain relative pin alignment on a strip prior to soldering to a PCB.

SUMMARY OF THE PRESENT INVENTION

It is therefore an object of the present invention to maintain precise pin alignment and spacing for the soldering operation in SMT PCB component assembly.

It is a further object of the invention to provide a means by robot, or by other automated assembly means, to pick up and place electrical contact leads and their carriers at precise locations on a PCB for SMT soldering.

It is a further object of the invention to eliminate the secondary assembly of discrete individual pins or terminals into a separate carrier of connector housing.

It is a further object to provide easy carrier strip removal without special tools or fixtures.

It is a further object to eliminate differential expansion coefficients when different materials are used for electrical contacts and their carrier.

It is a further object to reduce the per pin assembly costs when compared to functionally similar and performance equivalent connectors.

It is a further object to permit application of a lead-frame manufacturing process to SIP, QUAD and DIP pins, sockets, slip-on connectors, insulation displacement connectors, and a plurality of SMT interconnect systems.

It is a further object to eliminate the necessity of through holes in SMT PCB's for interconnect pins.

It is a further object to accommodate standard industry pin and row spacing conventions.

It is a further object to reduce the overall cost of interconnection in SMT PCB's.

Briefly, a first preferred embodiment of the present invention includes, in a continuous flat roll, a plurality of SIP sets consisting of: a row of precisely spaced, in-line pins for attachment to a surface mount technology printed circuit board, a rip strip carrier connected to each pin in the row of in-line pins by a weakened area, and an optional snap-off keeper at the opposite end of each pin in the row of pins. Prior to the attachment of the SIP set to the printed circuit board, the SIP set containing the required number of pre-formed pins is detached from the roll. The SIP sets are then soldered to the printed circuit board with the snap-off keeper and rip strip carrier still in place. The snap-off keeper is subsequently folded along the axis of its attachment to the pins to break it off. Following soldering, the rip strip carrier is lifted away from the printed circuit board, beginning at one end of the row of pins, breaking the attachment of the rip strip carrier at each respective weakened area, and continuing to lift away until the entire rip strip carrier is free.

A second preferred embodiment has a second row of pins on the opposite side of the rip strip carrier from the first row of pins, and is referred to as a DIP set. A variation of this embodiment places the second row of pins on the same side of the rip strip carrier as the first row of pins and the pins of the first and second rows are spaced and offset to allow the interleaved attachment of the respective rows of pins to the rip strip carrier. Attachment and removal of the optional snap-off keepers and the rip strip carrier proceeds as above for the case of the SIP set.

A third embodiment interposes a second snap-off keeper between the row of pins and the rip strip carrier. Such an embodiment allows the forces of ripping the rip strip carrier away from the printed circuit board to be isolated from the newly formed solder joints between the pins and the printed circuit board. The second snap-off keeper is then folded along the axis of the pins' attachment to the printed circuit board near the pins' attachment to the second snap-off keeper. This embodiment can be incorporated in the SIP set and DIP set cases described above.

A fourth embodiment has four rows of in-line spaced pins, each row aligned about the four edges of a square or rectangular rip strip carrier and attached to the rip strip carrier at weakened areas, each row is spaced a standardized distance from the adjacent and opposed rows, and with the opposed row parallel to to the other and aligned at right angles to the adjacent rows. Such embodiment describes a QUAD pack.

A fifth embodiment has attachable thermoplastic structural supports which, when assembled following carrier strip removal from the pins, mechanically attaches directly to the SMT PCB, and provides a means of electrically connecting wires, cables or connectors to the SMT pins, and thus isolates mechanical stresses and strains from the soldered connections.

The pins in the rows, above, need not be homogeneous, and indeed may be a mixture, or hybrid, of pin types that are arranged in an order according to the design of and particular needs of the printed circuit board.

An advantage of the present invention is that large numbers of pins may be picked up by a robot and precisely located/held down in position for soldering on a SMT PCB.

Another advantage of the present invention is that small, high density SMT PCB's may be constructed that functionally replace IC's, and these can be plugged directly into the sockets of the replaced IC's.

Another advantage of the present invention is the cost savings which results from manufacturing the carrier and pins from the same piece of material.

Another advantage of the present invention is the SMT soldering of a connector contacts to a PCB, followed by attachment of inexpensive thermoplastic structural supports for the contacts. The attachment of thermoplastic parts after soldering eliminates the current industry problems of: a) needing expensive, hard to process, high-temperature resistant plastics, and b) rework caused by the differential coefficients of expansion between plastic and metal materials in a SMT assembly. The resulting stresses imparted to the newly formed solder joints during the cooling process tend to increase necessary rework.

These and other objects and advantages of the present invention will no doubt become obvious to those of ordinary skill in the art after having read the following detailed description of the preferred embodiments which are illustrated in the various drawing figures.

IN THE DRAWINGS

FIGS. 1(a) and 1(b) are the first in a series of three diagrams that show the positioning and attachment of a DIP set, the rip strip carrier removal, and later installation of a snap-on plastic structure. The embodiment depicted in this series is a DIP set with the first and second rows of pins to one side of the rip strip carrier;

FIGS. 2(a) and 2(b) are second in the series of three diagrams that show the positioning and attachment of a DIP set, the rip strip carrier removal, and later installation of a snap-on plastic structure;

FIGS. 3(a) and 3(b) are the third in the series of three diagrams that show the positioning and attachment of a DIP set, the rip strip carrier removal, and later installation of a snap-on plastic structure;

FIGS. 4(a), 4(b), 4(c), and 4(d) are the top view, side view, end view, and detail of the weakened area attachment of the pins to the rip strip carrier, respectively, for the case of a DIP set embodiment that has the first row of pins on the opposite side of the rip strip carrier to the second row of pins;

FIGS. 5(a) and 5(b) are the top view and side view of the DIP set embodiment that has an interposed snap-off keeper between the rip strip carrier and each of the two rows of pins;

FIGS. 6(a), 6(b), and 6(c) are, firstly, a top view of a DIP set embodiment having a hybrid of pin types in the two rows attached to the rip strip carrier, secondly, an end view of the DIP set, before bending, and thirdly, an end view of the DIP set after bending;

FIG. 7 is an isometric projection of a SIP set, having two terminal lug pins, after attachment to a printed circuit board and after removal of the snap-off keeper, but before the removal of the rip strip carrier;

FIGS. 8(a) and 8(b) show the same SIP set assembly of FIG. 7, but with the rip strip carrier in the process of being removed and torn off the first contact. A dielectric terminal block, in FIG. 8(b), is shown positioned to cover the terminal pins that remain after the rip strip carrier is completely removed;

FIG. 9 is the final stage of the terminal pin and dielectric terminal bock assembly of FIGS. 7, 8(a), and 8(b), and shows a wire lug about to be attached by a screw;

FIGS. 10(a) and 10(b) are details of a second type of weakened area between a rip strip carrier and a contact pin that occurs along the rip line of FIG. 1 with FIG. 10(b) being a cross-sectional view taken along the line 10(b)—10(b) of FIG. 10(a);

FIGS. 11(a) and 11(b), are the first in a series of three which show a surface mounted DIP set with insulation displacement terminations in the process of having the rip strip carrier removed; also shown are an associated flat ribbon cable, a connector shroud, and a strain relief clamp;

FIGS. 12(a) and 12(b), are the second in a series of three and show the surface mounted DIP set with the insulation displacement terminations with the rip strip carrier removed;

FIGS. 13(a) and 13(b), are the third in a series of three and show the surface mounted DIP set with insulation displacement terminations with the rip strip carrier removed and the strain relief clamp installed on the shroud;

FIGS. 14(a), 14(b) and 14(c) respectively show the top view, side view, and end view of a DIP set with lead ends which have stamp-formed into individual spring sockets;

FIGS. 15(a) and 15(b) respectively show the side view and end view of a PCB edge SIP set of IC pins surface mount soldered to one side of a PCB, with the single row of in-line pins extending past, and projecting along the center line of the SMT PCB;

FIGS. 16(a) and 16(b) respectively show show the side view and end view of a PCB edge ZIP (Zigzag in-line package) set of IC pins surface mount soldered to one side of a PCB, with a first row of in-line pins extending past, and projecting along the surface plane of the ZIP side of the SMT PCB, and a second row of pins staggered and offset a standardized dimension to the first row; and FIGS. 17(a), 17(b) and 17(c) show the top view, side view, and front view, respectively, of a QUAD pack having pins surface mounted to a SMT PCB in four rows spaced about the perimeter of a square rip strip carrier having a rip tab located at one corner of the QUAD pack.

DETAILED DESCRIPTION OF THE PREFERRED EMBODIMENTS

Figure 1A:
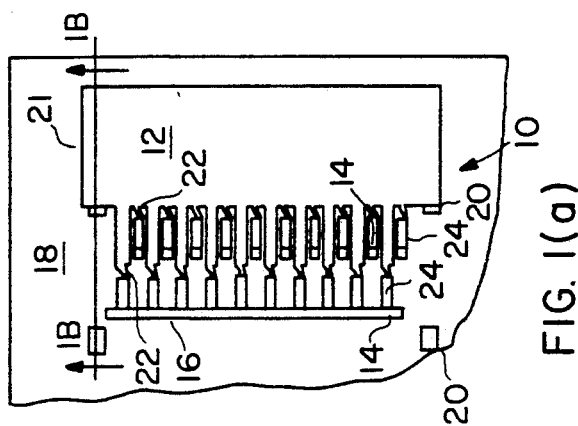
Figure 1B:
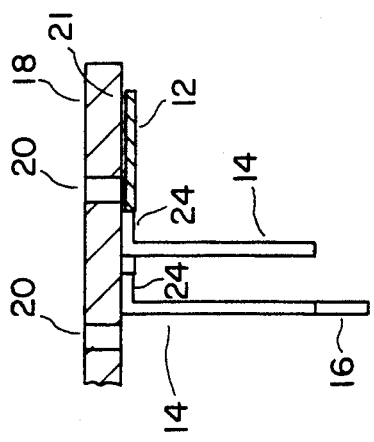
Figure 4A:
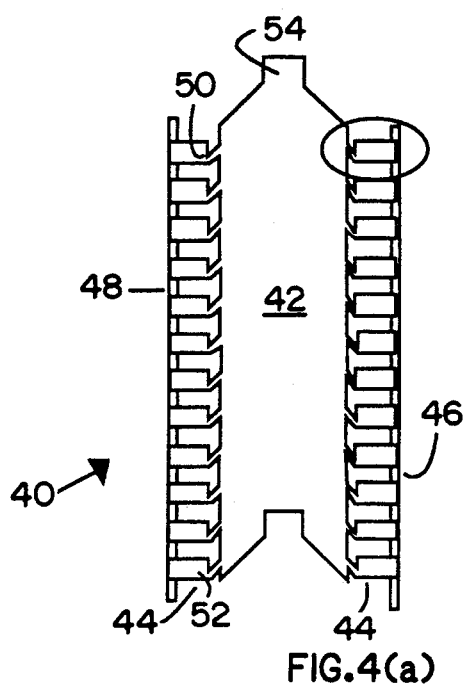
Figure 4B:
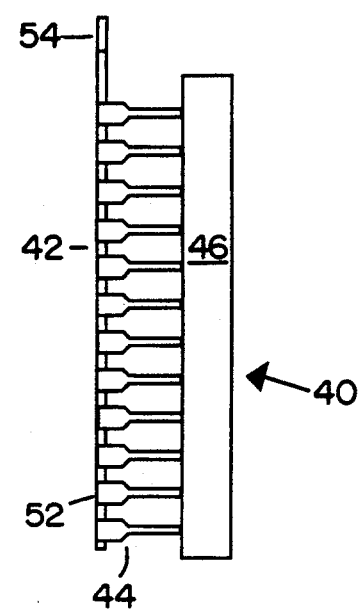
Figure 4D:
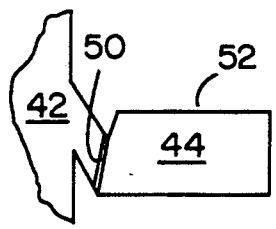
Figure 4C:
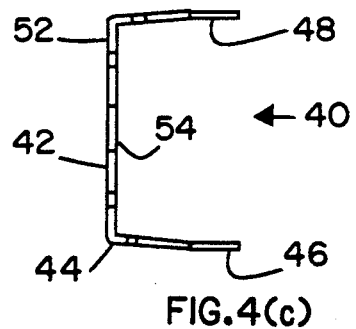

Referring now to FIGS. 1(a) and 1(b), a DIP set assembly, referred to by the general reference character 10, contains a rip strip carrier 12, pins 14, and snap-off keeper 16. The DIP set 10 is positioned for solder attachment to a surface mount technology (SMT) printed circuit board (PCB) 18 either by manual or automated means. Holes 20 encircle the attachment position of DIP set 10. The DIP set 10 is initially flat and connected in head-to-tail fashion to a plurality of DIP assemblies wound on a roll. The "L" shape of pins 14 are produced by a bending operation performed after the DIP set 10 is separated from the roll, but before it is attached to SMT PCB 18.

Figure 2A:
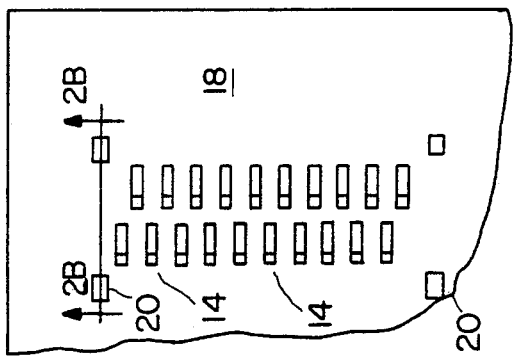
Figure 2B:
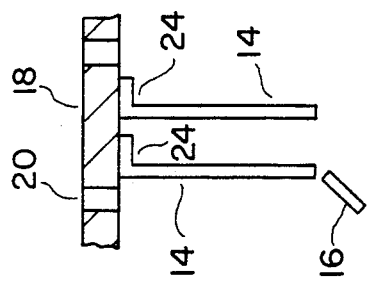

In FIGS. 2(a) and 2(b), DIP set 10 has had its rip strip carrier 12 removed completely after the soldering of pins 14 to SMT PCB 18 at pin legs 24. The rip strip carrier 12 is removed by lifting one end 21 up and away from SMT PCB 18. The lifting action will tear weakened areas 22 in succession, beginning near the end 21 and continuing to the opposite end. Snap-off keeper 16 are shown in the process of being removed by folding action, e.g., first to one side and then to the other. After a few side-to-side movements, the snap-off keeper 16 will break off the ends of pins 14.

Figure 3A:
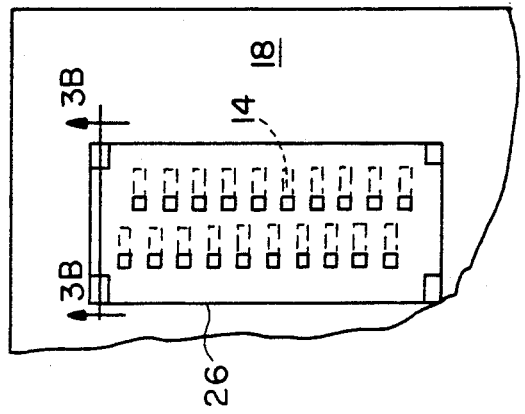
Figure 3B:
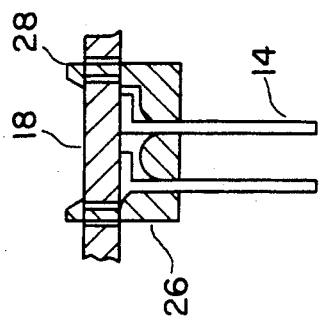

In FIG. 3(a) and 3(b), the snap-off keeper 16 and rip strip carrier 12 have been removed and a snap-on plastic structure 26 has been slipped over pins 14 and locked into holes 20. Tabs 28 lock the snap-on plastic structure 26 to SMT PCB 18.

Referring now to FIGS. 4(a)–4(d), a DIP set assembly, referred to by the general reference character 40, contains a rip strip carrier 42, a plurality of pins 44 in two rows, a pair of snap-off keepers 46 and 48, and a plurality of weakened areas 50. Pins 44 attach to a SMT PCB (not shown, but similar to 18 in FIGS. 1–3) at pin shoulders 52. The rip strip carrier 42 has a rip tab 54. In this embodiment, the rip strip carrier 42 is located between the rows of pins 44. To install DIP set 40 to a PCB, the rip strip carrier 42 and pin shoulders 52 are positioned flat against a PCB, as is similarly shown in FIGS. 1–3. The pin shoulders 52 contact solder pads on the PCB and are soldered to the pads. The rip strip carrier 42 is then lifted away from the PCB by pulling on rip tab 54, causing weakened areas 50 to break and separating pins 44 from rip strip carrier 42. The rip strip carrier 42 is pulled farther and farther away from the PCB and more and more weakened areas 50 tear until all are torn.

Figure 5A:
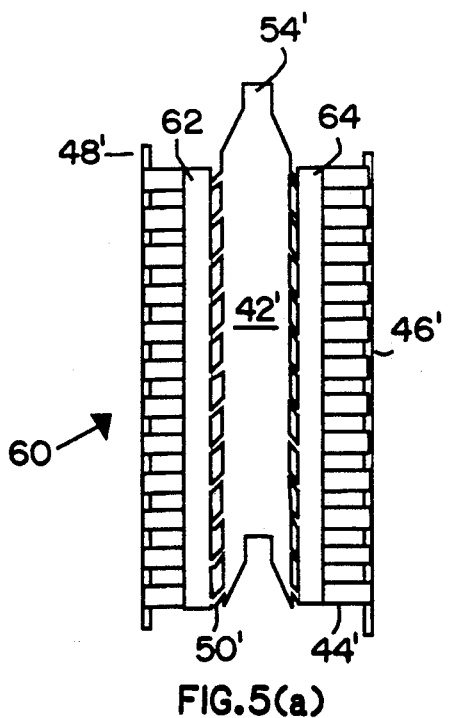
Figure 5B:
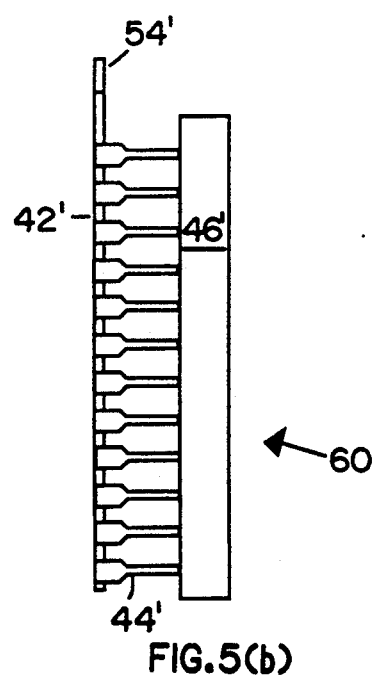

Referring to FIGS. 5(a) and 5(b), a DIP set assembly, referred to by the general reference character 60, contains elements similar to those in DIP set 40, such similar elements are given the same character identification, but have the addition of a prime notation. Therefore the DIP set 60 contains a rip strip carrier 42' having a rip tab 54', a pair of snap-off keepers 46' and 48', and weakened areas 50'. Additionally, snap-off keepers 62 and 64 interpose a plurality of pins 44' and a rip strip carrier 42'.

A hybrid of pin types is found in FIG. 6(a). FIGS. 6(b) and 6(c), respectively, show the hybrid DIP assembly; referred to by the general reference character 80, on end view, before and after bending of the pins to a final shape. Referring now to FIGS. 6(a)–6(c), the hybrid DIP assembly 80, contains a rip strip carrier 82 having a rip tab 84, a bending line 86 about which the assembly 80 will be bent at two places, a rip line 88 on which axis the rip strip carrier 82 will be separated from the rest of assembly 80, a set of component snap in pins 92, a set of slotted terminal pins 94, a set of flat ribbon cable IDC pins 96, a set of individual wire IDC pins 98, a set of eyelet pins 100, a pair of spade lug pins 102, and a pair of screw terminal pins 104. The screw terminal pins 104 receive a first bend at bending line 86 and a second bending in the opposite direction at a bending line 106. The end view of assembly 80 in FIG. 6(c) shows the after bending shape of screw terminal pins 104 and spade lug pins 102.

The hybrid DIP assembly 80 is supplied on a roll wherein individual assemblies are connected head-to-tail on the roll. In FIG. 6(a), the triangular area culminating in rip tab 84 can be seen to match a similarly shaped area at the opposite end of assembly 80. The assemblies are separated from the roll and bent to final shapes before being attached to a SMT PCB by soldering.

Figure 7:
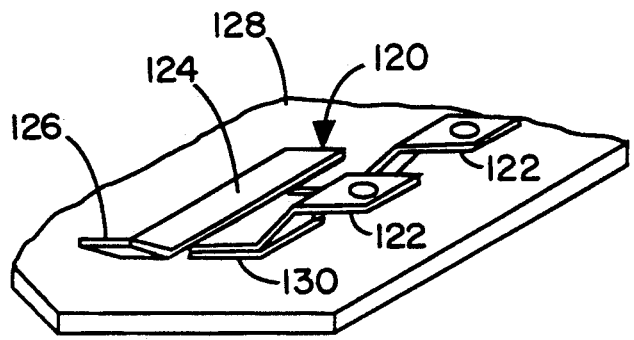
Figure 8B:
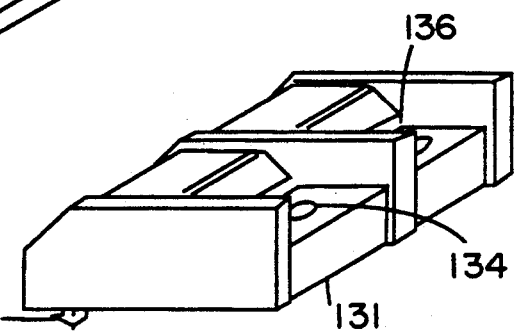
Figure 8A:
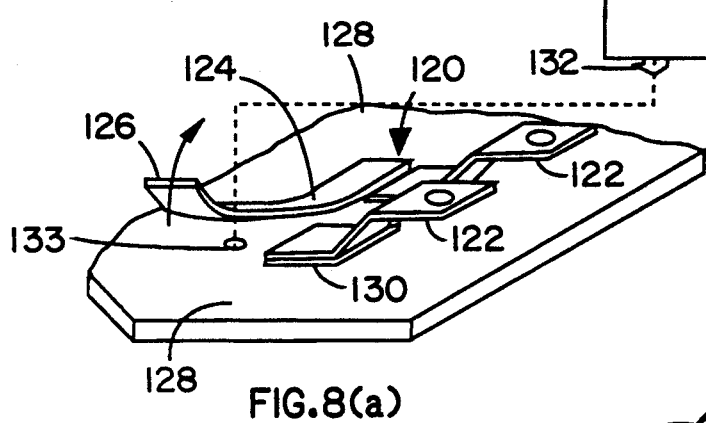
Figure 9:
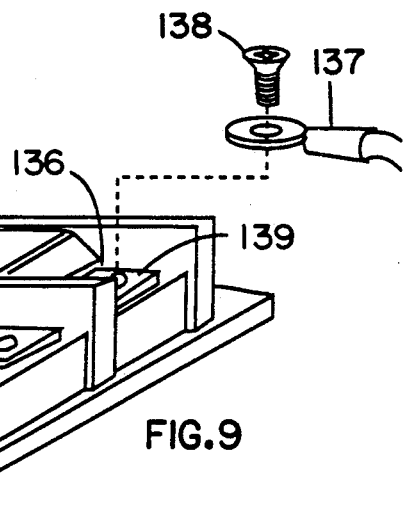

In the series of FIGS. 7, 8(a)–8(b), and 9, there are shown screw terminal pins similar to pins 102 of FIG. 6(a). In FIGS. 7, 8(a)–8(b), and 9, a SIP assembly, referred to by the general reference character 120, consists of a pair of screw terminal pins 122 and a rip strip carrier 124 having a rip tab 126. The screw terminal pins 122 are shown in FIG. 7 already soldered on to a SMT PCB 128 at a pair of solder pads 130. In FIG. 8(a), the rip tab 126 is being lifted to pull rip strip carrier 124 off the first of the screw terminal pins 122. In FIG. 8(b), a terminal block 131 is positioned to come down over screw terminal pins 122 after rip strip carrier 124 is completely removed. A snap detail 132 located on the bottom of the terminal block 131 mates with a through hole 133 in the SMT PCB. A screw hole 134, in the terminal block 131, is positioned over a threaded insert, not shown, installed in the underside of the terminal block 131. The holes in the screw terminal pins 122 align over the the screw hole 134 to receive a screw 135. In FIG. 9, the terminal block 130 has been mounted on SMT PCB 128 by passing terminals 122 through a respective slot 136 in terminal block 130. A wire lug and wire 137 is attached with a screw 138 to a finished terminal 139.

By attaching the terminal block 131 to the PCB 128 with the snap detail 132, and by subsequently inserting the screw 138 into the threaded insert on the terminal block 131, stresses which may be induced on the attached wire 137 will be transferred to the PCB 128 through the terminal block 131, and the forces will be isolated from the terminal pins 122 and the solder joint connection at solder pads 130 on the PCB 128.

Figure 10A:
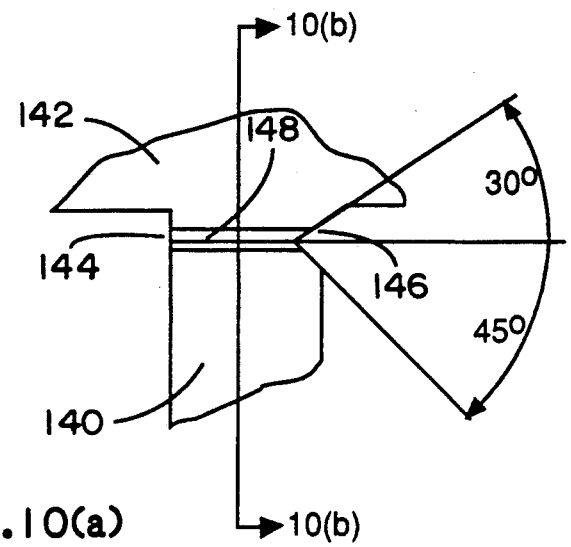
Figure 10B:
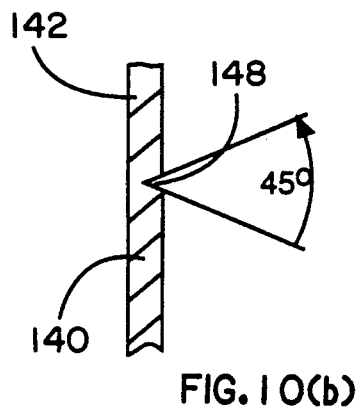

Each of the assemblies, above, have rip strip carriers that are separated from the pins on the respective assembly at a weakened area along the rip line. FIGS. 10(a) and 10(b) detail a second exemplary weakened area. Other types and configurations of weakened areas have been tried by the inventor, such as the type shown in FIG. 4(d) as weakened area 50, but the type described below and detailed in FIGS. 10(a) and 10(b) has been found to give the best results. Referring now to FIGS. 10(a) and 10(b), a pin 140 is attached to a rip strip carrier 142 by a weakened area 144. A notch 146 exists at one end of the area 144 and a groove 148 traverses area 144 across the width of the attachment of pin 140 to rip strip carrier 142. The groove 148 is located on the soldering soldering side surface of the SIP set or DIP set. The angles depicted in FIGS. 10(a) and 10(b) are nominal in the exemplary embodiment of the present invention.

Provision is made in each of the preceding examples to prohibit the attachment of the rip strip carrier to the SMT PCB during soldering operations by locating the groove 148 adjacent to but slightly offset from the solder pad on the SMT PCB. This will prevent solder wicking from the intended solder joint to the underside of the rip strip carrier.

Further provision is made in each of the preceding examples to prohibit the attachment of the rip strip carrier to the SMT PCB during soldering operations by applying a solder mask coating to the SMT PCB immediately surrounding the solder pads. The solder mask will inhibit solder wicking to the underside of the rip strip carrier as previously outlined.

An optional embodiment prohibits the attachment of the rip strip carrier to the SMT PCB during soldering operations by coating rip strip carrier; e.g., carrier 12 in FIGS. 1-3, rip strip carrier 42 and 42' and snap-off carriers 62 and 64 in FIGS. 4(a)-4(d) and 5(a)-5(b), rip strip carrier 82 in FIGS. 6(a)-6(c), rip strip carrier 124 in FIGS. 7 and 8(a)-8(b), and rip strip carrier 142 in FIGS. 10(a)-10(b) with a conventional solder mask. The solder mask should cover at least the surface of the rip strip carrier that can contact the SMT PCB, and preferably coat with solder mask the opposite side and edges as well.

Figure 11A:
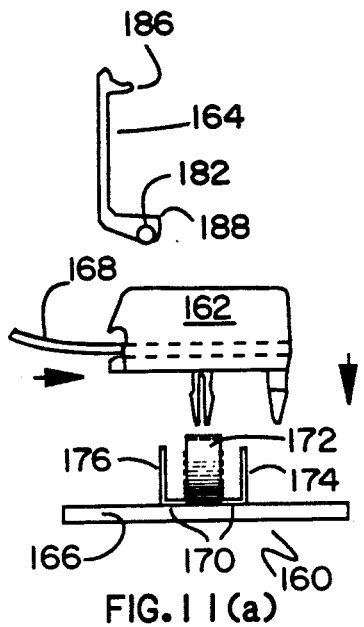
Figure 11B:
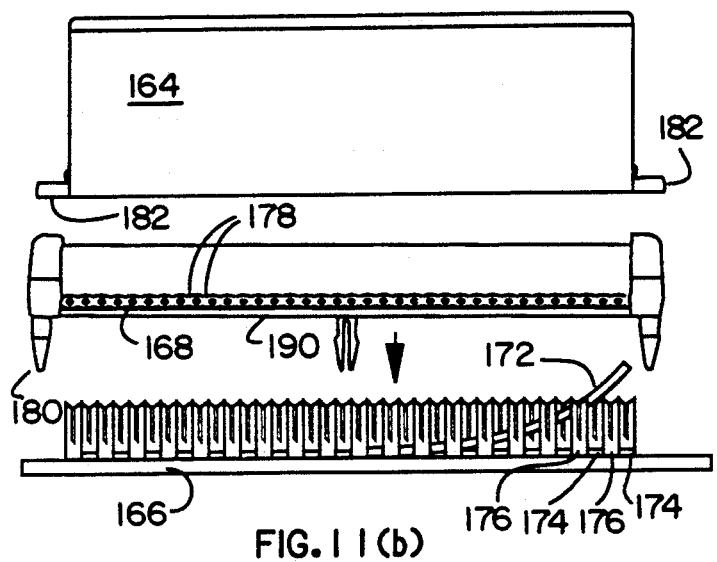

Referring now to all three FIGS. 11-13, a DIP set, referred to by the general reference character 160, is comprised of insulation displacement pins similar to those shown as 96 in FIG. 6(a). A connector shroud 162 and removable strain relief cover 164 are attached to a SMT PCB 166 after soldering, and a flat ribbon cable 168 is shown inserted into the shroud 162. Referring to only to FIG. 11(a), the DIP set 160 is shown attached to the SMT PCB 166 at solder joints 170. A rip strip carrier 172 is being removed. A first row of insulation displacement pins 174 are located in line and parallel to a second row of insulation displacement pins 176. FIG. 11(b) shows pins 176, at the front, being equally spaced and staggered relative to the pins 174 at the rear; thereby providing a close interval of overall spacing which matches with the conductor spacing of the ribbon cable 168. The end of ribbon cable 168 is inserted into the shroud 162 and is located by a plurality of concave details 178 on the upper surface of the cable insertion slot on the shroud 162.

Figure 12A:
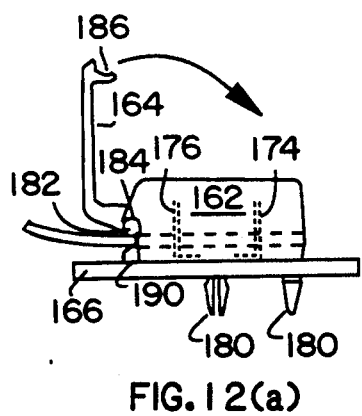
Figure 12B:
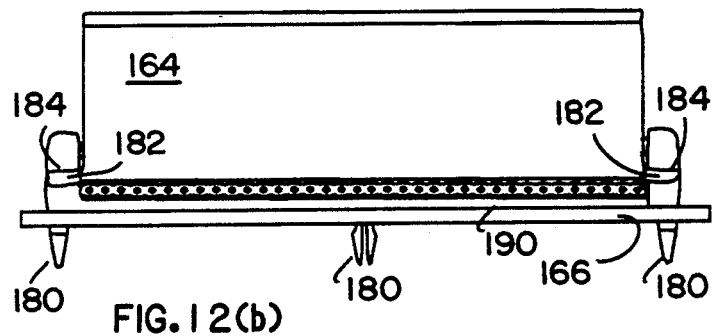

FIGS. 12(a) and 12(b) show the shroud 162 containing the cable 168 attached to the SMT PCB 166 and retained in place with latches 180. During the process of installing the shroud 162, the terminal ends of pins 174 and 176 pierce the cable 168 insulation at locations interleaving the wire conductors, this causes bare wires to assume electrical contact with the interior slot of the pins 174 and 176. The strain relief cover 164 is attached to the shroud 162 by aligning a pair of hinge pins 182 under a pair of hinges 184, and rotating a snap 186 toward the rear of the shroud 162. A cam 188 squeezes the cable 168 against a back-up detail 190 on the shroud. The cover 164 is then retained in the closed position by the snap 186 when it engages a mating detail (not shown) on the rear of the shroud 162.

Figure 13A:
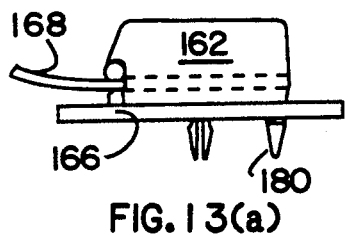
Figure 13B:
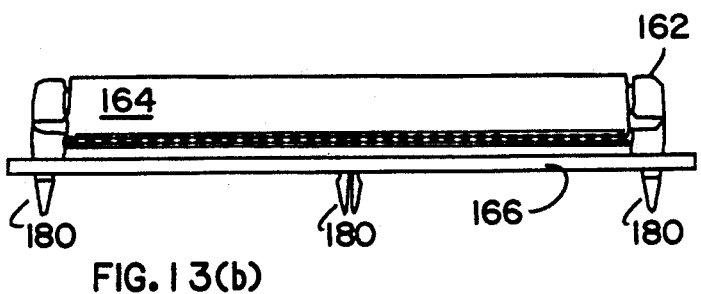

FIGS. 13(a) and 13(b) show the cable 168 and shroud 162 retained on the SMT PCB 166, the strain relief cover 164 installed on the shroud 162, and electrical connection made between the pins 174 and 176 and conductors within cable 168. The thermoplastic shroud 162 and strain relief cover 164 isolate any pull on the cable 168 from the electrical connection, and they additionally isolate pulling on the solder joints made between the PCB 166 and pins 174 and 176.

The thermoplastic shroud 162 and strain relief cover 164 shown in FIGS. 11-13 are injection molded of a low priced commodity resin, such as a Polyester with a service operating temperature range to 150° C. Because the plastic shroud 162 and cover 164 are attached to the pins 174 and 176 and PCB 166 after SMT soldering operations, it is not necessary that these components be made of expensive high temperature plastics, such as fiberglass reinforced modified polyethylene terephthalate which is capable of withstanding the soldering chamber temperatures which reach over 200° C. Otherwise, industry practice would require that the entire plastic and metal assembly of connectors be able to endure the surface mount soldering environment.

Figure 14A:
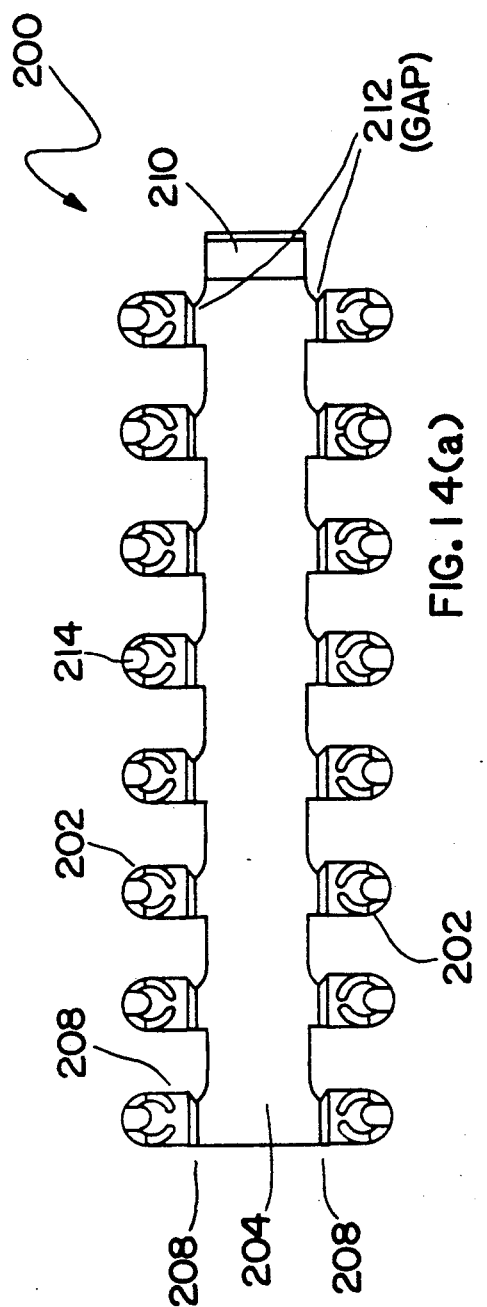
Figure 14B:
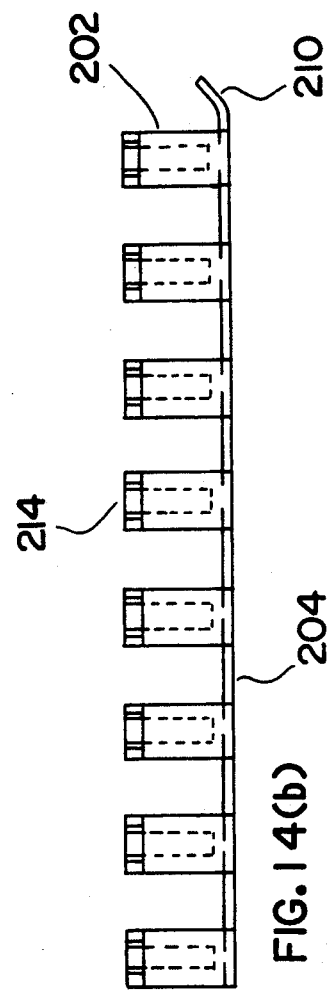
Figure 14C:
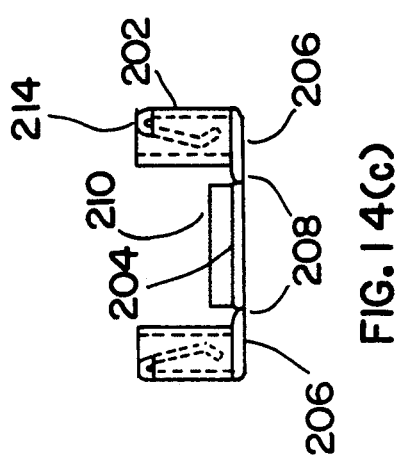

Referring now to FIGS. 14(a), 14(b), and 14(c), a DIP set of sockets, referred to by general reference character 200, is shown. A number of stamped sockets 202 are arranged in two parallel rows that are spaced at a consistent interval, usually 0.100", along the length of a rip strip carrier 204, and are connected to the rip strip carrier 204 by a plurality solder legs 206 at a respective weakened area 208. The DIP set 200 is mounted to a PCB (not shown) either by manual or automated means to the solder pads by soldering. The rip strip carrier 204 is removed by pulling a rip tab end 210 upward and to the opposite end of the DIP set 200, thereby separating the rip strip carrier 204 from the sockets 202 in sequential order from the rip tab end 210 until all of the weakened areas 208 have been severed from the sockets. An optional structural support, not shown, and functionally similar to the support 26 in FIGS. 3(a) and 3(b), may then be attached over the group of individual sockets 202.

The sockets 202 may be manufactured various ways. A constraint to sockets 202 design however, is the availability of suitable material from which to fabricate the sockets 202. The 0.100" spacing between the in-line sockets on a row allow for a maximum of 0.100" material width to be used for each socket. Although the length is practically unrestricted, and allows for design variations, the width is limited to the spacing between the contacts. Sockets 202 have an inside diameter equal to or less than 0.100". The sockets 202 may accommodate the insertion of pins larger than that, by a gap 212 positioned in the circumference of socket 202. A spring detail 214, generally referred to as a single beam, is shown which would apply a spring force on any inserted pin, thus assuring a reliable electrical connection between the sockets 202 and the mating pins.

An alternative embodiment of the spring detail 214 would be the fabrication of a three beam socket (not shown). The material of set 200 would be formed into an equilateral triangular tube having the central wall of the tube connected to a solder foot 208. The remaining two walls would be formed to apply spring tension against an inserted pin, thus forcing the pin against the interior surface of the tube.

Yet another alternative embodiment of the present invention comprises staggering parallel rows of sockets such that the sockets of one row are located along a rip strip carrier at positions coincidental with the center line of the space between adjacent sockets on the opposite row. This would tend to suggest a "zigzag in-line package" pattern of sockets along the length of the rip strip carrier. Such an assembly in its final state (after rip-strip carrier-removal and soldering) is generally referred to in the electronics industry as a ZIP socket.

Another alternative embodiment of the present invention comprises, in a SIP set of the DIP set of sockets shown in FIGS. 14(a), 14(b), and 14(c), a rip strip carrier and a single row of in-line sockets. In FIGS. 15(a) and B, a SIP set, referred by the general reference character 220, is shown containing a plurality of IC type pins 222 arranged in a single row, each pin 222 having a first end 223 and a second end 224, with the first end 223 attached to a rip strip carrier 225 at a number of weakened areas 226. A rip tab end 228, at one end of the rip strip carrier 225, is used to remove the rip strip carrier 225. The SIP set 220 is positioned, by manual or automated means, onto a pattern of solder pads (not shown) on a surface and near an edge of a SMT PCB 226. A soldering area 228 of the pins 222 are juxtaposed with the solder pads. The rip strip carrier 225 is sufficiently and relatively heavy enough to support the cantilevered pins 222 during the soldering process. Following completion of the soldering, the rip strip carrier 225 is removed by lifting rip tab end 230 from the surface of a PCB 232, thereby separating the rip strip carrier 225 from the soldered pins 222 in a sequential manner. The pins 222 are formed to align with the central axis of the PCB 232. The forming of a double bend in the pin 222 and the location of the bend at an edge of PCB 232 assists in isolating stresses on the solder joint areas 230 caused by insertion of the pins 222 into sockets (not shown). When stress isolation is not required, the pins 222 can be brought straight off the PCB 232 from the solder joints without any offset bends. The SIP sets 200 are formed and cut to the required number of pins 222 before mounting to the SMT PCB 232.

Referring to FIGS. 16(a) and 16(b), a DIP set, referred to by the general reference character 240, is shown mounted to one side of a SMT PCB 242, similar to the above. The SIP set 240 has a rip tab 244 located at one end of a rip strip carrier 246. IC-type pins 248 and 250 are attached to the rip strip carrier in two rows at the weakened areas 252. Pins 250 extend from a number of solder joints 254 without bends and on the same plane as the soldered side of the PCB 242. Pins 248 are parallel to and spaced 0.100" from the row of pins 250, but may be spaced at any other standardized distance. As viewed from the side in FIG. 16(b), pins 250 are each positioned at the centers between pins 248, and vice versa. Pins 248 and pins 250 therefore assume a zigzag pattern from one end of the DIP set 240 to the other. This configuration will allow the SMT PCB 242 to be attached to another PCB (not shown) by inserting the free end 224 of pins 248 and 250 into an industry standard ZIP socket (not shown) or into the variation of the DIP set described above and shown in FIG. 14.

In FIGS. 17(a), 17(b), and 17(c), a QUAD pack, referred to by the general reference character 260, is attached to the surface of a PCB 262, and contains four rows of pins 264 attached to the four sides of a rectangular rip strip carrier 266 at a number of weakened areas 268. The pins 264 are similar, and at a right angles between adjacent rows of pins, and coincidentally aligned with the pins in the opposite rows. A hybrid of pins 264, an example of which is shown in FIG. 6, may also be used, and the offsets of opposite rows may be used to allow interposition of sequential pins. A rip tab 270, located at one corner of the rip strip carrier 266, is lifted from the PCB 262 surface, causing the weakened areas 268 adjacent to the pins 264 to rip and to separate from the previously soldered pins 264. The separation of pins 264 with the next pin in opposite rows occurs simultaneously, such that two opposite weakened areas 268 are torn at once. The rip strip carrier 266 continues to sequentially separate from two pins 264 at a time until the final two pins 264, located at the corner opposite the rip tab 270 corner, separate. A rip notch 272 is a design similar to that shown in FIG. 10, and the rip notch 272 in FIG. 17(a) is positioned on the side of the pin which is nearest rip tab 270. Since the rip tab 270 separates from the pins 264 at an acute angle to weakened areas 268, the rip notch 272 must such as to assure the ripping starts with the tearing forces beginning nearest to the rip tab 270.

The SIP sets, DIP sets and QUAD packs of FIGS. 1 through 17, and their described variations, are best manufactured using either through a photochemical machining or progressive die stamping processes.

In photo-chemical machining, film artwork is made which represents the actual size configuration of the SIP set, DIP set, or QUAD pack "in the flat"—that is, the configuration of the part before any bends. A chemical resist is applied to the base material from which the part is to be made by printing the photo artwork directly on material such as beryllium copper or phosphor bronze. By exposing the resist coated material to a light source, the resist dissolves where the underlying material is to be removed. Subsequent immersion of the material in an caustic etch bath will remove, or "machine," material not covered by the chemical etch resist. What remains is then ready for plating and secondary bending or forming operations. Because of the finite size of chemical etch baths, strips of parts in excess of 24" are impractical.

In progressive die stamping, a continuous strip of the base material is fed into the stamping machine where the material undergoes high speed progressive operations which cut out unwanted material. A continuous strip of stamped parts is wound on a spool and can be plated. Following plating, the spool is unwound and fed into a shearing machine which cuts the continuous strip into parts at the desired length. The individual parts are then ready for mounting to a SMT PCB. All of the stamping, forming, etching, plating and shearing operations are usually completed at the manufacturing site. The user receives the SIP, DIP and QUAD sets ready for loading to the PCB.

Thermoplastic structural supports, clamps, terminal blocks used with the rip strip carrier terminals, as shown in FIGS. 1 through 17, can be manufactured from any suitable thermoplastic resin. Because vapor phase soldering and infra-red reflow soldering processes, used in surface mount assembly, subject the entire SMT PCB and all of its components to temperatures which can reach 250° C., the plastics must be manufactured from expensive, difficult to process, high temperature plastics such as fiberglass reinforced polyethylene terephthalate. The plastic components used in conjunction with the present invention are installed after the soldering process and are therefore preferred to be less expensive, easy to mold, polyester having temperature ratings up to 150° C.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A surface mount printed circuit board connector system comprising:
   a first plurality of contact pins each pin having a first end for being soldered to contact pads on a printed circuit board and a second end; and
   a rip strip carrier attached to said first end of the first plurality of contact pins by a first plurality of joints each having a weakened area and a rip notch, and the rip strip carrier having a rip tab at one end, whereby after soldering of the contact pins to the printed circuit board the rip strip carrier may be pulled off and torn across said weakened areas beginning at the respective rip notches nearest said rip tab.

2. The system of claim 1, further including:
   a less-than-soldering-temperature thermoplastic component having means to attach to the plurality of contact pins after the completion of soldering of the pins and the removal of the rip strip carrier, the thermoplastic component thereafter mechanically supporting the contact pins.

3. The system of claim 1, further including:
   a less-than-soldering-temperature thermoplastic component having means to attach to the plurality of contact pins after the completion of soldering of the pins and the removal of the rip strip carrier, the thermoplastic component thereafter isolating the mechanical stresses from a solder joint between the printed circuit board and said first end of the contact pins.

4. The system of claim 1, further including:
   a dielectric barrier block having means to attach to the plurality of contact pins after the completion of soldering of the pins and removal of the rip strip carrier, the dielectric barrier block thereafter electrically isolating the contact pins from one another.

5. The system of claim 1, wherein:
   the plurality of contact pins is a mixture of pin types comprising combinations of terminals for components, flat ribbon cables, individual wires, spade lugs, screw terminals, sockets and eyelets.

6. The system of claim 1, further including:
   a solder resist that is applied to the rip strip carrier, whereby solder attachment of the rip strip carrier to a surface mount technology printed circuit board after soldering operations is inhibited.

7. The system of claim 1, further including:
   a carrier strip attached to said second end of each of the plurality of contact pins.

8. The system of claim 1, wherein:
   the rip strip carrier and the contact pins are comprised of the same material.

9. The system of claim 1 further including:
   a second plurality of contact pins with each pin having a first end and a second end, said first end of each of the second plurality of contact pins being attached to the rip strip carrier, said attachment to the rip strip carrier being opposite to the line of attachment of each first end of the first plurality of contact pins, and each pin of the second plurality of contact pins having a weakened area and a rip notch.

10. The system of claim 9, further including:
    a less-than-soldering-temperature thermoplastic component having means to attach to the pluralities of contact pins after the completion of soldering of the pins and the removal of the rip strip carrier, the thermoplastic component thereafter mechanically supporting the pluralities of contact pins.

11. The system of claim 9, further including:
    a less-than-soldering-temperature thermoplastic component having means to attach to the pluralities of contact pins after completion of soldering of the pins and removal of the rip strip carrier, said thermoplastic component thereafter isolating the mechanical stresses from a solder joint between the printed circuit board and said first end of the pluralities of contact pins.

12. The system of claim 9, further including:
    a dielectric barrier block having means to attach to the pluralities of contact pins after completion of soldering of the pins and removal of the rip strip carrier, said dielectric barrier block thereafter electrically isolating the contact pins from one another.

13. The system of claim 9, wherein:
    the pluralities of contact pins are a mixture of pin types comprising combinations of terminals for components, flat ribbon cables, individual wires, spade lugs, screw terminals, sockets and eyelets.

14. The system of claim 9, further including:

a solder resist that is applied to the rip strip carrier, whereby solder attachment of the rip strip carrier to a surface mount technology printed circuit board after soldering operations is inhibited.

15. The system of claim 9, further including:

a carrier strip attached to said second end of each of the plurality of contact pins.

16. The system of claim 9, wherein:

the rip strip carrier and the pluralities of contact pins are comprised of the same material.

17. The system of claim 1, further including:

a second, third and fourth plurality of contact pins with each pin having a first end and a second end, said first end of each of the pluralities of contact pins being attached to the rip strip carrier at one of four edges, said attachment to the rip strip carrier being adjacent or opposite to the line of attachment of each first end of the first plurality of contact pins, and each pin of the pluralities of contact pins having a weakened area and a rip notch.

18. The system of claim 17, further including:

a less-than-soldering-temperature thermoplastic component having means to attach to the pluralities of contact pins after completion of soldering of the pins and removal of the rip strip carrier, the thermoplastic component thereafter mechanically supporting the pluralities of contact pins.

19. The system of claim 17, further including:

a less-than-soldering-temperature thermoplastic component having means to attach to the pluralities of contact pins after completion of soldering of the pins and removal of the rip strip carrier, the thermoplastic component thereafter isolating the mechanical stresses from a solder joint between the printed circuit board and said first end of the pluralities of contact pins.

20. The system of claim 17, further including:

a dielectric barrier block having means to attach to the pluralities of contact pins after completion of soldering of the pins and removal of the rip strip carrier, the dielectric barrier block thereafter electrically isolating the contact pins from one another.

21. The system of claim 17, wherein:

the pluralities of contact pins are a mixture of pin types comprising combinations of terminals for components, flat ribbon cables, individual wires, spade lugs, screw terminals, sockets and eyelets.

22. The system of claim 17, further including:

a solder resist that is applied to the rip strip carrier, whereby solder attachment of the rip strip carrier to a surface mount technology printed circuit board after soldering operations is inhibited.

23. The system of claim 17, further including:

a carrier strip attached to said second end of each of the pluralities of contact pins.

24. The system of claim 17, wherein:

the rip strip carrier and the pluralities of contact pins are comprised of the same material.

* * * * *